(12) United States Patent
Cheng et al.

(10) Patent No.: US 8,395,217 B1
(45) Date of Patent: Mar. 12, 2013

(54) ISOLATION IN CMOSFET DEVICES UTILIZING BURIED AIR BAGS

(75) Inventors: Kangguo Cheng, Schenectady, NY (US); Joseph Ervin, Wappingers Falls, NY (US); Jeffrey B. Johnson, Essex Junction, VT (US); Pranita Kulkarni, Slingerlands, NY (US); Kevin McStay, Hopewell Junction, NY (US); Paul C. Parries, Beacon, NY (US); Chengwen Pei, Danbury, CT (US); Geng Wang, Stormville, NY (US); Yanli Zhang, San Jose, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 13/283,031

(22) Filed: Oct. 27, 2011

(51) Int. Cl.
*H01L 27/12* (2006.01)
*H01L 21/84* (2006.01)

(52) U.S. Cl. ........... 257/350; 257/507; 257/E27.112; 257/E21.564; 438/154; 438/222; 438/422; 438/429

(58) Field of Classification Search .......... 257/350, 257/351, 354, 369, 507, 522, E27.112, E29.264, 257/E21.133, E21.564, E21.573; 438/151, 438/154, 157, 221, 222, 421, 422, 429, 442
See application file for complete search history.

(56) References Cited

U.S. PATENT DOCUMENTS

| | | | |
|---|---|---|---|
| 5,126,817 A * | 6/1992 | Baba et al. | 257/347 |
| 6,150,232 A | 11/2000 | Chan et al. | |
| 6,268,637 B1 | 7/2001 | Gardner et al. | |
| 6,518,147 B1 | 2/2003 | Villa et al. | |
| 7,038,289 B2 * | 5/2006 | Marty et al. | 257/501 |
| 7,400,024 B2 * | 7/2008 | Kunnen | 257/511 |
| 7,566,657 B2 | 7/2009 | Kamins | |
| 7,700,425 B2 | 4/2010 | Wagner et al. | |
| 7,749,786 B2 | 7/2010 | Wells | |
| 7,867,864 B2 * | 1/2011 | Nuttinck et al. | 438/300 |
| 2012/0104547 A1 * | 5/2012 | Ervin et al. | 257/532 |
| 2012/0241866 A1 * | 9/2012 | Yamasaki | 257/368 |

OTHER PUBLICATIONS

Yasuo Kunii and Michiharu Tabe, "Lateral Solid-Phase Epitaxy of Vacuum-Deposited Amorphous Si Film over Recessed SiO2 Patterns," pp. L352-L354, Japanese Journal of Applied Physics, vol. 24, No. 5 on May 5, 1985, Japan.

* cited by examiner

*Primary Examiner* — Tuan N. Quach
(74) *Attorney, Agent, or Firm* — Alexander Viderman; Joseph Petrokaitis; Matthew C. Zehrer

(57) ABSTRACT

A semiconductor device structure having an isolation region and method of manufacturing the same are provided. The semiconductor device structure includes a silicon-on-insulator (SOI) substrate. A plurality of gates is formed on the SOI substrate. The semiconductor device structure further includes trenches having sidewalls, formed between each of the plurality of gates. The semiconductor device structure further includes an epitaxial lateral growth layer formed in the trenches. The epitaxial lateral growth layer is grown laterally from the opposing sidewalls of the trenches, so that the epitaxial lateral growth layer encloses a portion of the trenches extended into the SOI substrate. The epitaxial lateral growth layer is formed in such way that it includes an air gap region overlying a buried dielectric layer of the SOI substrate.

18 Claims, 6 Drawing Sheets

ISOLATION IN CMOSFET DEVICES UTILIZING BURIED AIR BAGS

BACKGROUND

Field of the Invention

The present invention relates to integrated circuit fabrication, and more particularly, to isolation in complementary metal-oxide-semiconductor field effect transistor (CMOSFET) devices utilizing buried air bags.

The well known prior art CMOSFET device includes individual source, drain and gate regions arranged in the well known configuration of the gate region separating the source region from the drain region. The CMOSFET device is caused to operate in either the enhancement mode or the depletion mode. With proper voltage levels and polarity established at the source and drain regions, enhancement mode operation is characterized as no current flow between source and drain where no enabling signal is applied to the gate. When an enabling signal of the correct level and polarity is applied to the gate, current flows between source and drain. With proper voltage levels and polarity established at the source and drain, depletion mode operation is characterized as current flow between source and drain when no disabling signal is applied to the gate. When a disabling signal of the correct level and polarity is applied to the gate, current flow is interrupted between source and drain.

Generally, every CMOSFET device must be electrically isolated from other devices to ensure that it operates without electrical interference from other devices. With the high integration of the semiconductor devices, improper electrical isolation among devices will cause current leakage, consuming a significant amount of power as well as compromising device functionality. Some examples of reduced functionality include latch-up, noise margin degradation, voltage threshold shift, cross-talk, and excessive power usage, and the like.

A number of prior art processes for isolating devices in integrated circuits have been available, but none have been completely satisfactory due to severe design constraints which must be adhered to. Accordingly, it is desirable to provide CMOSFET devices and method for isolating those devices with reduced utilized silicon area.

SUMMARY

In an aspect of the invention, a method for formation of an isolation region in a semiconductor device comprises providing a silicon-on-insulator (SOI) substrate. The SOI substrate comprises a semiconductor substrate, a buried dielectric layer overlying the semiconductor substrate and an upper semiconductor layer overlying the buried dielectric layer. The method further comprises forming a plurality of gates on the SOI substrate. The plurality of gates comprises a first dielectric layer overlying the SOI substrate and a conductive material layer overlying the first dielectric layer. The method further comprises forming trenches between each of the plurality of gates. The trenches extend through the conductive material layer and the first dielectric layer and expose the upper semiconductor layer. The method further comprises forming sidewall spacers covering opposing sidewalls of the trenches. The method further comprises extending the trenches through the upper semiconductor layer of the SOI substrate to expose the buried dielectric layer. The method further comprises forming, in the trenches, an epitaxial lateral growth layer. The epitaxial lateral growth layer grows laterally from the opposing sidewalls of the trenches to enclose a portion of the trenches extending into the upper semiconductor layer. The epitaxial lateral growth layer is grown in such a way that it includes an air gap region overlying the buried dielectric layer.

In another aspect of the invention, a semiconductor device structure comprises a silicon-on-insulator (SOI) substrate. The SOI substrate comprises a semiconductor substrate, a buried dielectric layer overlying the semiconductor substrate and an upper semiconductor layer overlying the buried dielectric layer. The semiconductor device structure further comprises a plurality of gates formed on the SOI substrate. Each of the plurality of gates comprises a first dielectric layer overlying the SOI substrate and a conductive material layer overlying the first dielectric layer. The semiconductor device structure further comprises trenches having sidewalls, formed between each of the plurality of gates. The trenches extend through the conductive material layer, the first dielectric layer, and the upper semiconductor layer of the SOI substrate. The semiconductor device structure further comprises sidewall spacers covering a portion of opposing sidewalls of the one or more trenches. The portion covered by the sidewall spacers comprises at least the first dielectric layer and the conductive material layer. The semiconductor device structure further comprises an epitaxial lateral growth layer formed in the trenches. The epitaxial lateral growth layer is grown laterally from the opposing sidewalls of the trenches, so that the epitaxial lateral growth layer encloses a portion of the trenches extended into the upper semiconductor layer. The epitaxial lateral growth layer is formed in such way that it includes an air gap region overlying the buried dielectric layer.

A more complete understanding of the present invention, as well as further features and advantages of the present invention, will be obtained by reference to the following detailed description and drawings. It is to be understood that both the foregoing general description and the following detailed description are exemplary and explanatory only, and should not be considered restrictive of the scope of the invention, as described and claimed. Further, features or variations may be provided in addition to those set forth herein. For example, embodiments of the invention may be directed to various combinations and sub-combinations of the features described in the detailed description.

BRIEF DESCRIPTION OF THE SEVERAL VIEWS OF THE DRAWINGS

The present invention is described in the detailed description which follows in reference to the noted plurality of drawings by way of non-limiting examples of exemplary embodiments of the present invention.

DETAILED DESCRIPTION

The present invention relates to a structure and method of forming an isolation region in a semiconductor device. More specifically, the present invention comprises a silicon-on-insulator (SOI) semiconductor device. The SOI substrate comprises a semiconductor substrate, a buried dielectric layer overlying the semiconductor substrate, and an upper semiconductor layer overlying the buried dielectric layer. A plurality of gates are formed on the SOI substrate. Each gate comprises a first dielectric layer overlying the SOI substrate and a conductor layer overlying the first dielectric layer. The semiconductor device structure further comprises one or more trenches having sidewalls, formed between each of the plurality of gates. These trenches extend through the conductive material layer, the first dielectric layer, and the upper semiconductor layer of the SOI substrate. The semiconductor device structure further comprises one or more sidewall spacers covering a portion of opposing sidewalls of the one or more trenches. The portion covered by the sidewall spacers comprises at least the first dielectric layer and the conductive material layer. The semiconductor device structure further comprises an epitaxial lateral growth layer formed in the one or more trenches. The epitaxial lateral growth layer is grown laterally from the opposing sidewalls of the one or more trenches so that the epitaxial lateral growth layer encloses a portion of the trench extending into the upper semiconductor layer and includes an air gap region overlying the buried dielectric layer. One advantage of the structure presented in various embodiments of the present invention is that there is very little processing required above the normal process flow steps.

Figure 1:
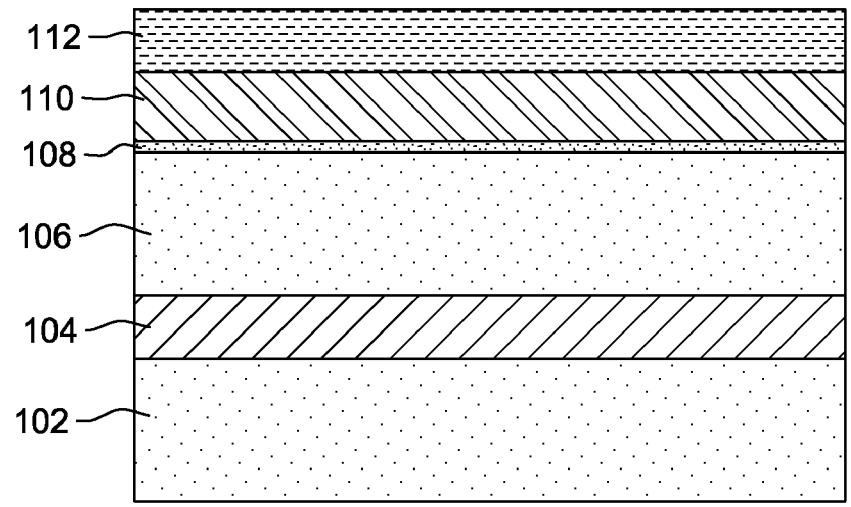
FIGS. 1 through 5 schematically illustrate method steps for formation of an isolation region during the fabrication of complementary metal-oxide-semiconductor (CMOS) field effect transistor (FET) devices in accordance with an embodiment of the present invention.

FIGS. 1 through 5 schematically illustrate method steps for formation of an isolation region during the fabrication of CMOSFET devices in accordance with an embodiment of the present invention. Referring to FIG. 1, the method in accordance with this exemplary embodiment of the invention begins with providing a semiconductor layer 102 of the SOI structure. Semiconductor layer 102 comprises a conventional silicon wafer. Preferably, the initial wafer is a single crystal silicon wafer.

Still referring to FIG. 1, a buried dielectric layer 104 is formed so as to cover semiconductor layer 102. Buried dielectric layer 104 is preferably silicon dioxide ($SiO_2$) formed through a deposition oxidation process. Buried dielectric layer 104 is commonly referred to as a buried oxide or "BOX" layer and will so be referred herein. Buried dielectric layer 104 may be deposited to a thickness of approximately 10-200 nm, and preferably approximately 50-150 nm.

After that, the silicon active layer of the SOI wafer may be formed by bonding upper semiconductor layer 106 to the buried dielectric layer 104. Bonding is generally performed in two stages. In a first stage, the substrates are heated to approximately 600° C., in an inert environment for approximately three hours. The heating of the first stage causes bonding of the upper semiconductor layer 106 to the buried dielectric layer 104 due to Van der Waals forces. In a second stage of the bonding process, the bonded structure is heated to approximately 1050-1200° C. for 30 minutes to two hours to strengthen the bond between the buried dielectric layer 104 and upper semiconductor layer 106. The BOX layer 104 isolates upper semiconductor layer 106 from semiconductor layer 102 below the BOX layer 104.

The next step involves forming a gate electrode stack on the upper semiconductor layer 106. The gate electrode stack includes a first dielectric (gate dielectric) layer 108 and a conductive material (gate electrode) layer 110. The first dielectric layer 108 can be thermally grown (for example, silicon oxide) or be a deposited dielectric, such as high-k dielectric. The high-k dielectric generally has a k value >10. Exemplary high-k dielectrics can include hafnium oxide, hafnium silicon oxide, hafnium silicon oxynitride, lanthanum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, lead zinc niobate. In one embodiment, the high-k gate dielectric comprises both hafnium and zirconium, and the like. The thickness of the first dielectric layer 108 may be approximately 5 to approximately 30 angstroms, and preferably approximately 8 to approximately 20 angstroms. First dielectric layer 108 can be formed using other types of dielectric materials, thicknesses, or techniques.

Next, a conductive material layer 110 is deposited on the first dielectric layer 108. Conductive material layer 110 comprises, in one embodiment, polysilicon. Alternatively, other types of gate electrodes can be used. The thickness of the gate electrode layer 110 is, for example, but not limited to, from approximately 100 to approximately 800 angstroms. To form conductive material layer 110 techniques, such as chemical vapor deposition (CVD), can be used among others.

In one embodiment, conductive material layer 110 comprises a doped gate electrode layer. For example, conductive material layer 110 comprises either n-type or p-type dopants having a concentration of approximately $1 \times 10^{18}$ to approximately $1 \times 10^{21}$ ion/$cm^3$. Other types of dopants and concentrations are also useful. The dopants, for example, are incorporated into the conductive material layer 110 by ion implantation. Other techniques, such as insitu-doping, can also be used for incorporating the dopants. In some embodiments of this invention, undoped gate electrode layer 110 may be used.

The next step in the process may involve forming a pad layer 112 of an insulating material, such as silicon nitride, on the upper surface of gate electrode stack. The pad layer 112 may be formed using, for example, low-pressure chemical vapor deposition (LPCVD) depositing to a thickness of approximately 5 to approximately 20 nm.

Figure 2:
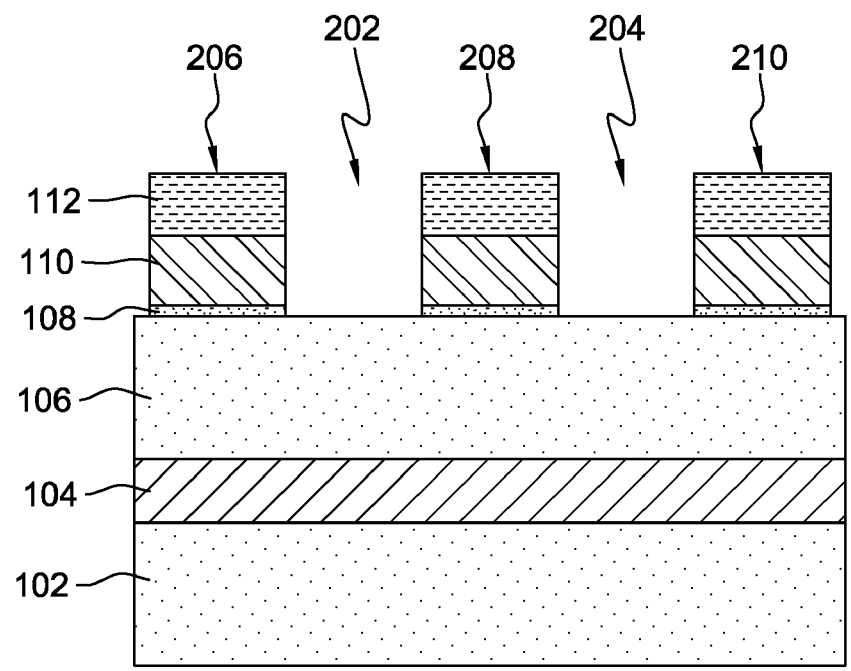

The next step involves etching trenches 202 and 204 within the formed SOI structure, as shown in FIG. 2. A hard mask layer (not shown) of a suitable masking material may be deposited on pad layer 112 to a thickness of approximately 8 to approximately 20 nm. The hard mask layer may be patterned using a conventional photolithography technique. The hard mask may be configured for patterning a plurality of gates 206, 208, and 210. Then, trenches 202, 204 may be formed using an anisotropic dry etch technique, such as a Reactive Ion Etch (RIE), etching through pad layer 112, conductive material layer 110, and first dielectric layer 108, exposing upper semiconductor layer 106 of the SOI structure. Then, the hard mask may be removed, preferably, using a hydrofluoric acid solution. FIG. 2 shows resultant trenches 202 and 204 formed between each of the plurality of gates 206, 208, and 210.

Figure 3:
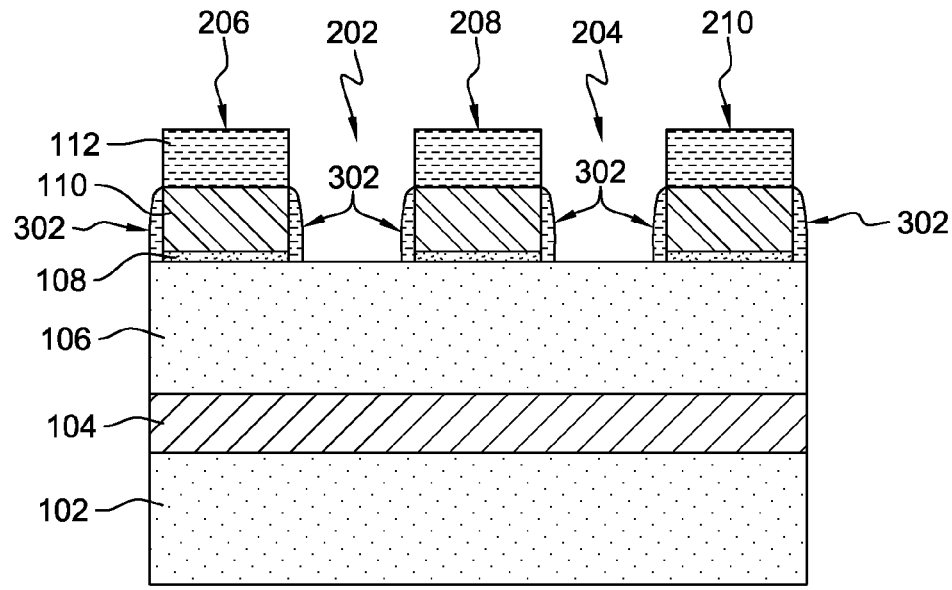

Portions of pad layer 112 are subsequently removed to form sidewall spacers 302 as shown in FIG. 3. The removal is preferably accomplished using an anisotropic etching process which etches more rapidly in a vertical than in a horizontal direction. In the embodiment illustrated in FIG. 3, spacers 302 cover the sidewall surfaces of the conductive material layer 110 and first dielectric layer 108 entirely. Forming sidewall spacers 302 with silicon nitride may be advantageous because sidewall spacers 302 formed with nitride may limit outdiffusion of impurities from the gate and/or source drain regions, described below in conjunction with FIG. 5. This diffusion limiting capability may be especially significant in the case of p-channel CMOS transistors, which are typically implanted with boron. Boron is known to exhibit significant outdiffusion from silicon into adjacent oxide layers during CMOSFET fabrication.

Figure 4:
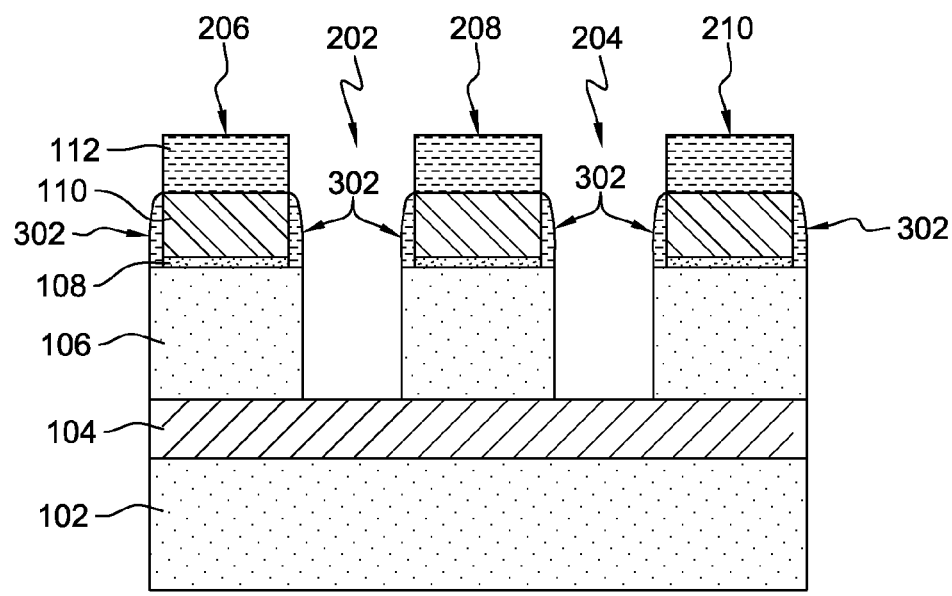

FIG. 4 illustrates a next step in the process of fabrication of CMOSFET devices, according to an exemplary embodiment of the present invention. Trenches 202, 204 may be extended through the upper semiconductor layer 106 of the SOI substrate to define the openings for the source and drain regions of CMOSFET devices. Trenches 202, 204 may be extended using an anisotropic dry etch technique, such as a RIE, etching through upper semiconductor layer 106 and exposing a portion of buried dielectric layer 104, as illustrated in FIG. 4.

Figure 5:
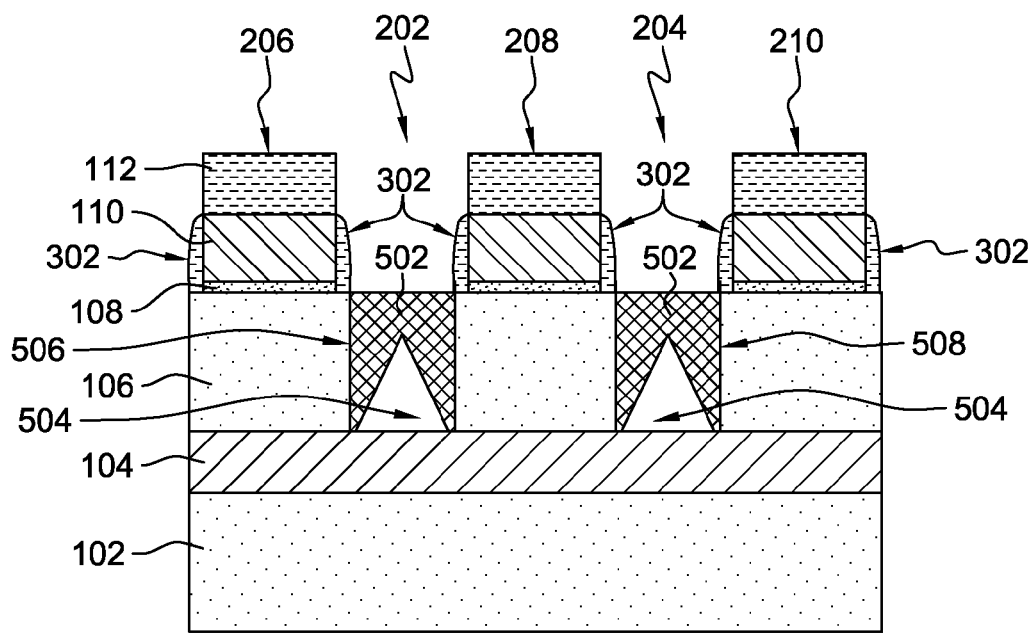

Turning now to FIG. 5, a next step in the process is illustrated to show formation of the in-situ doped epitaxial source/drain regions 506 and 508 having a doping concentration of approximately $1\times10^{19}$ to approximately $1\times10^{22}$ ion/cm$^3$. The phrase "source/drain region(s)" is used herein to describe a region that may serve as either a source or a drain. The skilled artisan will appreciate that a source/drain region may function as a source or a drain depending upon how it is interconnected during metallization. In an embodiment, source/drain regions 506 and 508 may be formed using a lateral epitaxial growth process to partially fill the portion of trenches 202, 204 extending into the upper semiconductor layer 106, below sidewall spacers 302. As illustrated, growth within trenches 202, 204 may be performed, by means known in the art, from both sidewalls serving as seeding templates such that an air gap region 504 is formed overlying the BOX layer 104. A small volume of any gas or gases present in the epitaxial growth process ambient may normally be captured in the air gap region 504 after the completion of epitaxial growth process. A particular ambient may be captured in the air gap region 504 if desired by introducing the selected ambient into the epi tool prior to closure of epitaxial source/drain regions 506 and 508. For example, nitrogen may be introduced into the epitaxial growth tool to capture nitrogen in the air gap region 504. In one embodiment, air gap region 504 is shaped as a triangle. It should be noted that a substantially triangular shape for air gap region 504 may be obtained naturally as epitaxial layer 502 grown laterally from the opposing sidewalls of trenches 202, 204 converge. However, the present invention is not so limited, as air gap region 504 may have other shapes, such as oval, square, and the like. A desired shape for air gap region 504 may be obtained by controlling the epitaxial growth process. Epitaxial lateral growth layer 502 may be formed from any semiconductor material, such as silicon, silicon-germanium, silicon carbide, silicon-germanium-carbon, and the like or combinations thereof, which is capable of being formed utilizing a lateral epitaxial growth method. In one embodiment, epitaxial lateral growth layer 502 may be grown at 1000° C.

At this stage of the process, an isolation region 504 has been formed. The air gap region 504 will have a dielectric constant k of about 1.0. With a dielectric constant of about 1.0, the air gap region 504 combined with the sidewall spacers 302 exhibits a lower combined effective dielectric constant than a comparably sized conventional trench isolation structure. As a result, the structure presented in various embodiments of this invention provides very low capacitance and correspondingly excellent electrical isolation for various devices on the substrate. One of the advantages of the structure of the various embodiments of the present invention is that there is very little processing required above the normal process flow steps, which minimizes process complexity and expense. The key is to form isolation region (air gap region) 504 during the formation of the epitaxial source/drain regions 506, 508.

Figure 6:
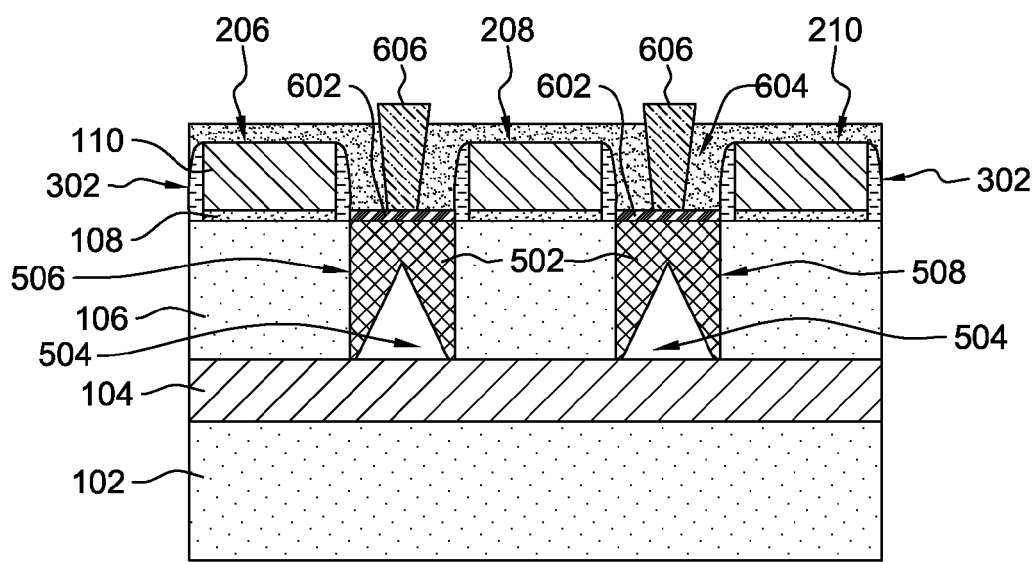
FIG. 6 illustrates a section view of a CMOSFET portion of an integrated circuit having an isolation region after completion of CMOSFET device formation in accordance with an embodiment of the present invention.

Once air gap isolation region 504 is obtained, the process continues with the conventional process flow for CMOSFET device formation. FIG. 6 illustrates additional steps that comprise the conventional process flow. As shown in FIG. 6, silicide layer 602 is formed above each of the source/drain regions 506, 508 using traditional processing techniques. For example, a layer of refractory metal (not shown in FIG. 6) is formed above the source/drain regions 506, 508. The refractory metal layer may comprise a variety of materials that may be subsequently converted to a metal silicide 602. For example, the refractory metal layer may comprise cobalt, titanium, tantalum, tungsten, molybdenum, zirconium, platinum, nickel, and the like. The refractory metal layer may be formed by a variety of known techniques for forming such layers, such as a physical vapor deposition (PVD), plasma enhanced chemical vapor deposition (PECVD), sputtering, LPCVD, and the like. The refractory metal layer is then converted to metal silicide layer 602, as shown in FIG. 6, above each of the source/drain regions 506, 508 using known silicidation processing techniques. The thickness of the metal silicide layer 602 may be varied as a matter of design choice. However, using current generation technology, the metal silicide layer 602 may have a thickness ranging from approximately 50 to approximately 200 angstroms. Silicide layer 602 is formed in order to provide relatively broad area, low-resistivity (and therefore low-resistance) contacts to the source/drain regions 506, 508.

Following formation of silicide layer 602, pad layer 112 is removed by utilizing, for example, a chemical mechanical polishing (CMP) process. Subsequently, an interlevel dielectric ("ILD") layer 604 may be deposited across the semiconductor topography. Preferably, ILD layer 604 is of different composition from the dielectric material used to form spacers 302. For example, if spacers 302 are formed from silicon nitride, ILD layer 604 may be a silicon dioxide. Contact vias may then be formed in ILD layer 604 above silicide layers 602 by, for example, but not limited to, patterning and selective etching ILD layer 604 using a photoresist. The vias may then be filled with a conductor to form contacts 606 with the source/drain regions 506 and 508, as depicted in FIG. 6.

Figure 7:
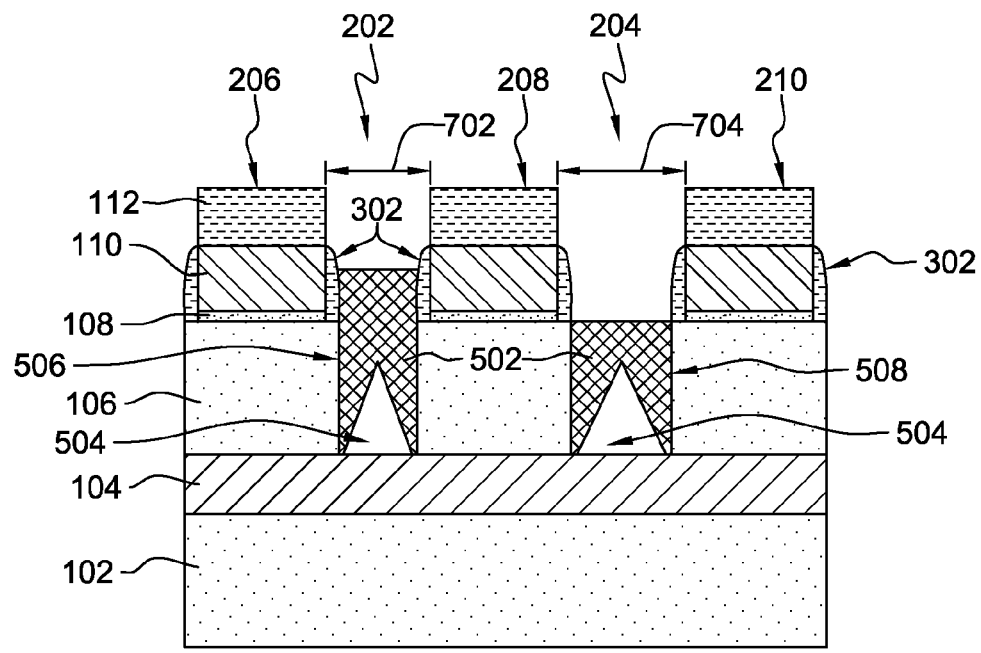
FIG. 7 illustrates a section view of an isolation region in a CMOSFET portion of an integrated circuit in accordance with another embodiment of the present invention.

FIG. 7 illustrates another embodiment of the present invention. In FIG. 7, reference numerals that are the same as those used in FIGS. 1-6 refer to structures that are the same as those depicted and described with reference to FIGS. 1-6. With respect to the embodiment of the invention shown in FIGS. 1-6 it should be noted that a plurality of gates 206, 208, 210 are evenly spaced. In other words, the gate-to-gate distance between adjacent gates (referred to herein as "pitch" or "gate pitch") is uniform. In the alternative embodiment illustrated in FIG. 7, the gate pitch is not uniform for trenches 202 and 204. By way of example, and not by way of limitation, the gate pitch 702 between adjacent gates 206 and 208 (width of trench 202) may be from approximately 50 to approximately 100 nm and the gate pitch 704 between adjacent gates 208 and 210 may be from approximately 80 to approximately 400 nm. In this embodiment, in order to achieve approximately the same level of reduced resistance as in embodiment illustrated in FIGS. 1-6, a raised source/drain region 506 may be formed in trench 202 (having smaller pitch than trench 204) during lateral epitaxial growth process, described above in conjunction with FIG. 5. As shown in FIG. 7, raised source/drain region 506 at least partially covers sidewall surfaces of the opposing sidewall spacers 302 in trench 202. In this embodiment, once lateral epitaxial growth process captures air gap region 504 in the enclosed lower portion of the trench 202 below sidewall spacers 302, as shown in FIG. 7, the epitaxial growth process may be continued with vertical growth, using a newly grown epitaxial layer 502 as a seeding template to fill, at least partially, the portion of the trench 202 between sidewall spacers 302, as illustrated in FIG. 7. It should be noted that in this embodiment the air gap region 504 is also shaped as a triangle. However, as previously indicated, the present invention is not so limited, as air gap region 504 may have other shapes, such as oval, square, and the like.

Figure 8:
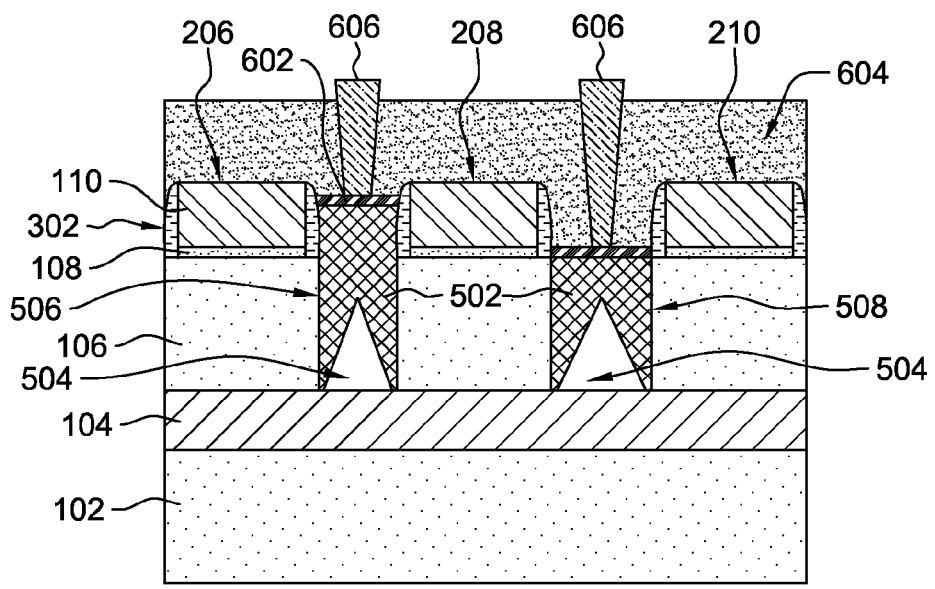
FIG. 8 illustrates a section view of a CMOSFET portion of an integrated circuit having an isolation region after completion of CMOSFET device formation in accordance with the embodiment of the present invention illustrated in FIG. 7.

FIG. 8 illustrates a section view of a CMOSFET portion of an integrated circuit having an isolation region after completion of CMOSFET device formation in accordance with the embodiment of the present invention illustrated in FIG. 7. As depicted in FIG. 8, silicide layer 602 is formed above the raised source/drain region 506 in trench 202 between sidewall spacers 302. It should be noted that as a result of formation of raised source/drain region 506 in trench 202, which has a smaller pitch than trench 204, a portion of the trench 202 that gets filled with the ILD material 604 is substantially smaller than the corresponding portion of the trench 204.

Figure 9:
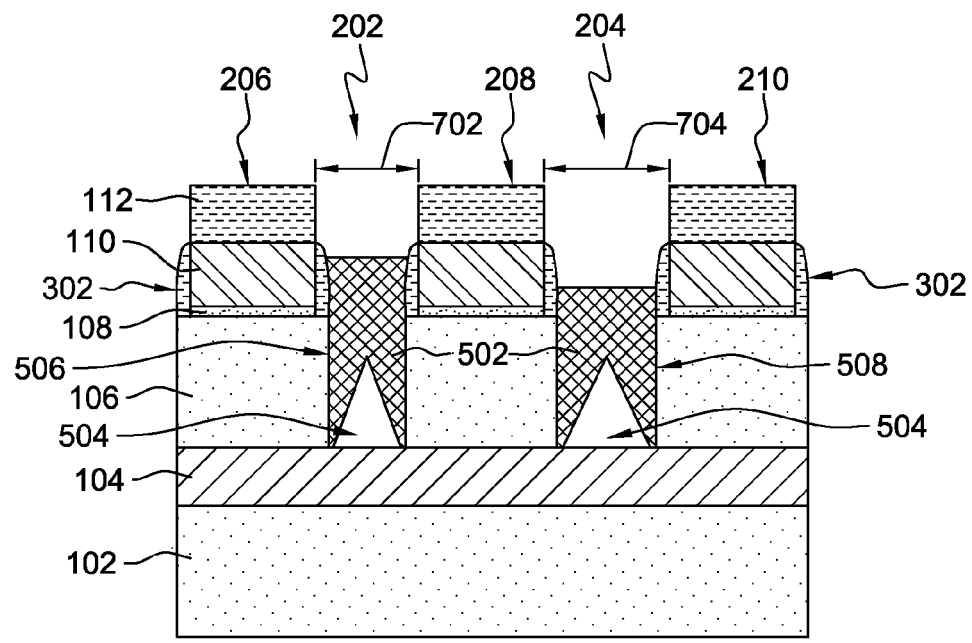
FIG. 9 illustrates a section view of an isolation region in a CMOSFET portion of an integrated circuit in accordance with yet another embodiment of the present invention.

FIG. 9 illustrates yet another embodiment of the present invention. In this embodiment, similarly to the embodiment illustrated in FIG. 7, the gate pitch 702 and 704 is not uniform for trenches 202 and 204, respectively. However, in this embodiment, raised source/drain regions 506 and 508 are formed in both trenches 202 and 204. As illustrated in FIG. 9, the epitaxial source/drain regions 506 and 508 may be grown to different heights. By way of example, and not by way of limitation, in trench 204 (having greater pitch 704 than trench 202) epitaxial lateral growth layer 502 may be grown to a height that is less than the height of the epitaxial lateral growth layer 502 in trench 202. Control of the height of source/drain regions 506 and 508 may be achieved, for example, by controlling various epitaxial growth process parameters, such as growth temperature, use of additional species to enhance growth, and the like. In an embodiment, a height of the source/drain region 506 in trench 202 may be from approximately 80 to approximately 140 nm and a height of the source/drain region 508 in trench 204 may be from approximately 50 to approximately 100 nm.

Figure 10:
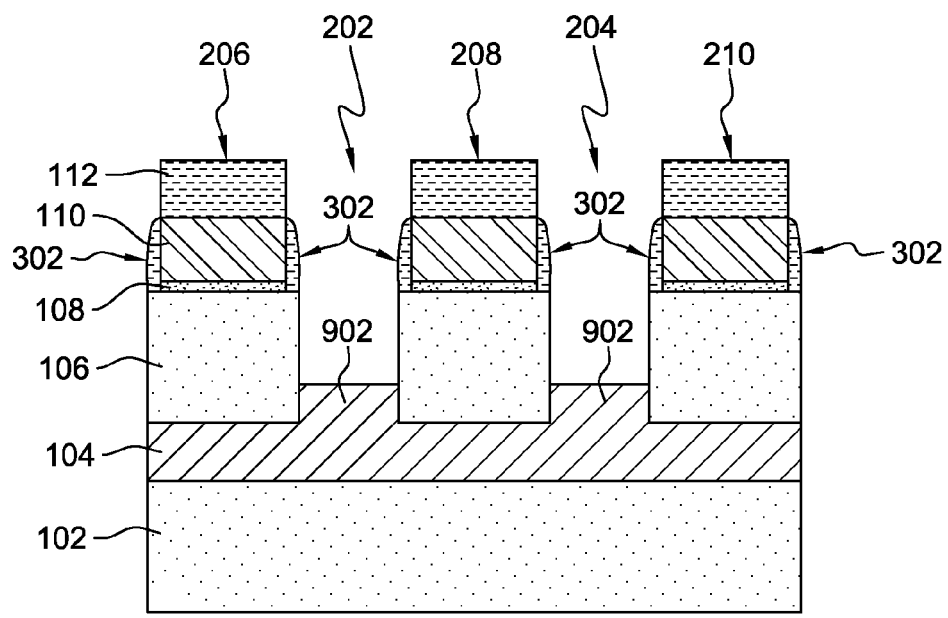
FIGS. 10 and 11 schematically illustrate intermediate method steps for formation of an isolation region during the fabrication of CMOSFET devices in accordance with yet another embodiment of the present invention.
Figure 11:
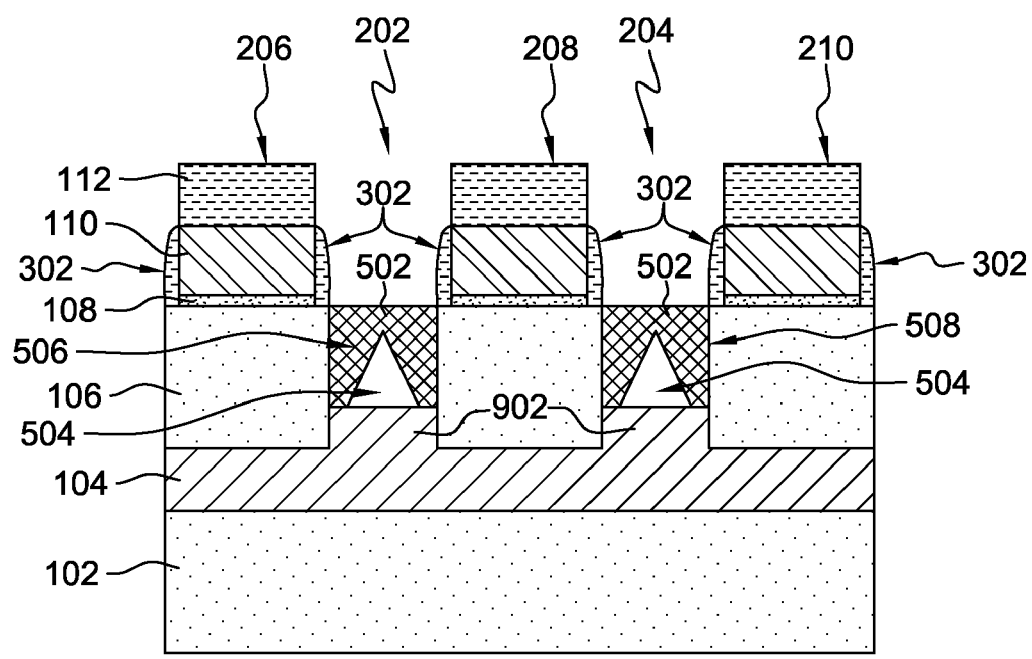

FIGS. 10 and 11 illustrate yet another embodiment of the present invention. In FIG. 10, reference numerals that are the same as those used in FIGS. 1-6 refer to structures that are the same as those depicted and described with reference to FIGS. 1-6. As depicted in FIG. 10, once trenches 202 and 204 have been extended through the upper semiconductor layer 106 of the SOI substrate to expose BOX layer 104 a second dielectric layer 902 may be deposited at the bottom of trenches 202 and 204 prior to the step that employs a lateral epitaxial growth process, described above in conjunction with FIG. 5. The second dielectric material layer 902 may comprise the same material as the BOX layer 104, preferably, silicon dioxide. The second dielectric material layer 902 may be deposited at the bottom of trenches 202 and 204 by PECVD or by any other deposition method known in the art. The second dielectric material layer 902 may be deposited to a thickness from approximately 10 to approximately 40 nm.

Subsequently, according to the exemplary embodiment illustrated in FIG. 10, lateral epitaxial growth within trenches 202, 204 may be performed, by means known in the art, from both sidewalls of exposed upper semiconductor layer 106 serving as a seeding templates such that an air gap region 504 is formed overlying the second dielectric layer 902. In this embodiment, an enhanced isolation region comprises the air gap region 504 overlying the second dielectric material layer 902 in the lower portion of the source/drain regions 506 and 508, as shown in FIG. 11.

Thus, as described above, the present invention relates to a structure and a method of forming an isolation region in a semiconductor device. A plurality of gates 206, 208, 210 are formed on the SOI substrate. Each gate comprises a first dielectric layer 108 overlying the SOI substrate and a conductor layer 110 overlying the first dielectric layer 108. The semiconductor device structure further comprises one or more trenches 202 and 204 having sidewalls, formed between each of the plurality of gates 206, 208, 210. One or more trenches 202, 204 extend through the conductor layer 110, the first dielectric layer 108, and the upper semiconductor layer 106 of the SOI substrate. The semiconductor device structure further comprises one or more sidewall spacers 302 covering a portion of opposing sidewalls of the one or more trenches 202, 204. The semiconductor device structure further comprises an epitaxial lateral growth layer 502 formed in the one or more trenches 202, 204. The epitaxial lateral growth layer 502 is grown laterally from the opposing sidewalls of the one or more trenches 202, 204 so that the epitaxial lateral growth layer 502 encloses a portion of the one or more trenches extending into the upper semiconductor layer 106 and includes an air gap region 504 overlying the buried dielectric layer 104. Advantageously, the resulting air gap region 504 provides excellent isolation without adding extra complexity to conventional process flow steps.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for formation of an isolation region in a semiconductor device, the method comprising the steps of:
   providing a silicon-on-insulator (SOI) substrate comprising a semiconductor substrate, a buried dielectric layer overlying the semiconductor substrate and an upper semiconductor layer overlying the buried dielectric layer;
   forming a plurality of gates on the SOI substrate, the plurality of gates comprising a first dielectric layer overlying the SOI substrate and a conductive material layer overlying the first dielectric layer;

forming one or more trenches between each of the plurality of gates, the one or more trenches extending through the conductive material layer and the first dielectric layer to expose the upper semiconductor layer;

forming one or more sidewall spacers covering opposing sidewalls of the one or more trenches;

extending the one or more trenches through the upper semiconductor layer of the SOI substrate to expose the buried dielectric layer; and forming, in the one or more trenches, an epitaxial lateral growth layer, wherein the epitaxial growth layer grows laterally from the opposing sidewalls of the one or more trenches to enclose a portion of the one or more trenches extending into the upper semiconductor layer, so that the epitaxial lateral growth layer includes an air gap region overlying the buried dielectric layer.

2. The method of claim 1, wherein the semiconductor device comprises a complementary metal-oxide-semiconductor (CMOS) field effect transistor.

3. The method of claim 1, wherein the air gap region has a substantially triangular shape.

4. The method of claim 1, wherein forming the epitaxial lateral growth layer comprises forming one or more raised source/drain regions between each of the plurality of gates.

5. The method of claim 1, wherein forming the one or more trenches comprises forming a first trench having a first gate pitch and forming a second trench having a second gate pitch, and wherein forming the epitaxial lateral growth layer comprises forming, in the first trench, a first raised source/drain region having a first height and forming, in the second trench, a second raised source/drain region having a second height.

6. The method of claim 5, wherein the second gate pitch is greater than the first gate pitch and wherein the second height is less than the first height.

7. The method of claim 5, wherein the first gate pitch ranges from approximately 50 to approximately 100 nm, the second gate pitch ranges from approximately 80 to approximately 400 nm, the first height ranges from approximately 80 to approximately 140 nm, and the second height ranges from approximately 50 to approximately 100 nm.

8. The method of claim 1, further comprising forming a second dielectric layer in a bottom portion of the one or more trenches prior to forming the epitaxial lateral growth layer, so that the second dielectric layer overlies the buried dielectric layer.

9. The method of claim 8, wherein the epitaxial lateral growth layer includes the air gap region overlying the second dielectric layer.

10. A semiconductor device comprising:

a silicon-on-insulator (SOI) substrate comprising a semiconductor substrate, a buried dielectric layer overlying the semiconductor substrate and an upper semiconductor layer overlying the buried dielectric layer;

a plurality of gates formed on the SOI substrate, the plurality of gates comprising a first dielectric layer overlying the SOI substrate and a conductive material layer overlying the first dielectric layer;

one or more trenches having sidewalls, formed between each of the plurality of gates, the one or more trenches extend through the conductive material layer, the first dielectric layer, and the upper semiconductor layer of the SOI substrate;

one or more sidewall spacers covering a portion of opposing sidewalls of the one or more trenches, the portion comprising at least the first dielectric layer and the conductive material layer; and an epitaxial lateral growth layer formed in the one or more trenches, wherein the epitaxial lateral growth layer is grown laterally from the opposing sidewalls of the one or more trenches, so that the epitaxial lateral growth layer encloses a portion of the one or more trenches extended into the upper semiconductor layer, and so that the epitaxial lateral growth layer includes an air gap region overlying the buried dielectric layer.

11. The semiconductor device of claim 10, wherein the semiconductor device comprises a complementary metal-oxide-semiconductor (CMOS) field effect transistor.

12. The semiconductor device of claim 10, wherein the air gap region has a substantially triangular shape.

13. The semiconductor device of claim 10, wherein the epitaxial lateral growth layer comprises one or more raised source/drain regions between each of the plurality of gates.

14. The semiconductor device of claim 10, wherein the one or more trenches comprise a first trench having a first gate pitch and a second trench having a second gate pitch, and wherein the epitaxial lateral growth layer comprises, formed in the first trench, a first raised source/drain region having a first height and, formed in the second trench, a second raised source/drain region having a second height.

15. The semiconductor device of claim 14, wherein the second gate pitch is greater than the first gate pitch and wherein the second height is less than the first height.

16. The semiconductor device of claim 14, wherein the first gate pitch ranges from approximately 50 to approximately 100 nm, the second gate pitch ranges from approximately 80 to approximately 400 nm, the first height ranges from approximately 80 to approximately 140 nm, and the second height ranges from approximately 50 to approximately 100 nm.

17. The semiconductor device of claim 10, further comprising a second dielectric layer formed in a bottom portion of the one or more trenches, so that the second dielectric layer overlies the buried dielectric layer.

18. The semiconductor device of claim 17, wherein the epitaxial lateral growth layer includes the air gap region overlying the second dielectric layer.

* * * * *